United States Patent
Van Der Werf et al.

(10) Patent No.: US 7,307,712 B2
(45) Date of Patent: Dec. 11, 2007

(54) METHOD OF DETECTING MASK DEFECTS, A COMPUTER PROGRAM AND REFERENCE SUBSTRATE

(75) Inventors: Jan Evert Van Der Werf, Waalre (NL); Auke Jan Mud, Oss (NL)

(73) Assignee: ASML Netherlands B.V., Veldhoven (NL)

(*) Notice: Subject to any disclaimer, the term of this patent is extended or adjusted under 35 U.S.C. 154(b) by 297 days.

(21) Appl. No.: 10/693,603

(22) Filed: Oct. 27, 2003

(65) Prior Publication Data
US 2004/0130711 A1 Jul. 8, 2004

(30) Foreign Application Priority Data
Oct. 28, 2002 (EP) .................................. 02257465

(51) Int. Cl.
*G01N 21/00* (2006.01)
(52) U.S. Cl. .................................. 356/237.2; 356/237.5
(58) Field of Classification Search ................ None
See application file for complete search history.

(56) References Cited

U.S. PATENT DOCUMENTS

| | | | | |
|---|---|---|---|---|
| 4,692,943 A * | 9/1987 | Pietzsch et al. | ............. | 382/148 |
| 5,353,116 A * | 10/1994 | Tanigawa et al. | ............ | 356/390 |
| 5,764,793 A * | 6/1998 | Omae et al. | ................. | 382/149 |
| 5,812,563 A | 9/1998 | Hedlund et al. | | |
| 6,252,412 B1 | 6/2001 | Talbot et al. | | |
| 6,426,168 B1 | 7/2002 | Johnson | | |
| 6,630,996 B2 * | 10/2003 | Rao et al. | ................. | 356/237.5 |
| 6,643,006 B1 * | 11/2003 | Hsu et al. | ................. | 356/237.2 |
| 6,691,052 B1 * | 2/2004 | Maurer | ........................ | 702/81 |
| 6,895,109 B1 * | 5/2005 | Schemmel et al. | ......... | 382/149 |
| 6,919,958 B2 * | 7/2005 | Stanke et al. | ............ | 356/237.2 |
| 6,967,711 B2 * | 11/2005 | Gui | .............................. | 355/67 |
| 2002/0026626 A1 * | 2/2002 | Randall et al. | ............... | 716/19 |
| 2002/0121915 A1 | 9/2002 | Alonso Montull et al. | | |
| 2003/0137665 A1 * | 7/2003 | Ando | ........................ | 356/394 |
| 2004/0043303 A1 * | 3/2004 | Lassiter et al. | ................ | 430/5 |

FOREIGN PATENT DOCUMENTS

| | | |
|---|---|---|
| JP | 59-004019 | 1/1984 |
| JP | 59-108318 | 6/1984 |
| JP | 63-122119 | 5/1988 |
| JP | 7-229846 | 8/1995 |
| JP | 10-062964 | 3/1998 |
| WO | WO 2004/008244 A2 | 1/2004 |

OTHER PUBLICATIONS

Japanese Official Action issued for Japanese Patent Application No. 2003-403784, dated Apr. 14, 2006.
European Office Action issued for European Patent Application No. 03 256 755.4-2222, dated Nov. 20, 2006.

* cited by examiner

*Primary Examiner*—Michael P. Stafira
(74) *Attorney, Agent, or Firm*—Pillsbury Winthrop Shaw Pittman LLP

(57) ABSTRACT

A method of detecting mask defects in which a reference substrate is patterned by the mask immediately after manufacture of the mask is disclosed. The reference substrate is stored in clean conditions while IC manufacture takes place. When a mask defect is suspected, a resist coated substrate, the test substrate, is patterned by exposure of the mask. The patterns on the reference substrate and the test substrate are compared to determine if there is a mask defect. The location of the mask defect can be found by scanning smaller areas of the patterns.

16 Claims, 2 Drawing Sheets

METHOD OF DETECTING MASK DEFECTS, A COMPUTER PROGRAM AND REFERENCE SUBSTRATE

CROSS-REFERENCE TO RELATED APPLICATIONS

This application is based on and claims priority from European Patent Application No. 02257465.1 filed on Oct. 28, 2002, the contents of which are incorporated herein by reference.

BACKGROUND

1. Field

The present invention relates generally to the field of lithography. More specifically, the present invention relates to a method of detecting errors in patterning devices used in photolithographic apparatus.

2. Description of Related Art

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such a patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step and scan apparatus—each target portion is irradiated by progressively scanning the mask pattern under the projection beam in a given reference direction (the "scanning" direction) while synchronously scanning the substrate table parallel or anti parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation sensitive material (resist). Prior to this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion implantation (doping), metallization, oxidation, chemo mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0 07 067250 4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

Defects in the mask, or mask pattern can result in defective devices, such as ICs, and are therefore undesirable. Mask defects typically fall into three categories. Firstly, contamination, such as dirt or stains, on a transparent or reflective part of the mask can block and/or distort exposing radiation and print onto the substrate as though it were a part of the pattern. Secondly, cracks in the mask material (e.g. quartz) can block or scatter radiation, therefore causing distorted images. Thirdly, pattern distortions in the mask manufacturing process may occur. These distortions include pinholes, chrome spots, pattern extensions, missing parts, breaks in the pattern and bridges between adjacent patterns. Of the three sources of defects, contamination is the most prevalent and to minimize the possibility of contamination, the mask is usually kept in clean conditions during use. Pellicles are often used on a mask to minimize or eliminate contaminants on the mask after the pellicle is installed.

To avoid manufacturing defective devices, a defective mask should be detected as soon as possible so that it can be repaired or replaced. Conventionally, when a defect in the mask and/or mask pellicle is suspected or as part of maintenance, the mask is removed from the lithographic apparatus and examined. If the mask and/or pellicle is undamaged the mask is returned to the apparatus and production continues. If the mask and/or pellicle is damaged, the mask and/or pellicle is repaired or replaced and then returned to the lithographic apparatus. However, in removing a mask from the lithographic apparatus, the mask and pellicle are subjected to increased probabilities of contamination and/or damage. Additionally, in checking for defects, production of devices will slow or cease and it is therefore advantageous for inspection and examination to be as fast as possible, without compromising accuracy.

SUMMARY

It is, therefore, an aspect of the present invention to provide an improved method of detecting defects in the patterning device.

This and other aspects are achieved according to at least one embodiment in a method of detecting defects in a patterning device including using the patterning device in a photolithographic process to print a reference pattern on a reference substrate; using the patterning device in a photolithographic process to expose a pattern for manufacture of a device on a production substrate different from said reference substrate; using the patterning device in a photolithographic process to print a test pattern on a test substrate; and comparing the printed test pattern to the printed reference pattern to detect a defect in the patterning device.

A photolithographic apparatus may be used to complete the photolithographic process, whereby the photolithographic apparatus includes a radiation system for supplying a projection beam of radiation; a support structure for supporting a patterning device, the patterning device serving to pattern the projection beam according to a desired pattern; a substrate table for holding a substrate; and a projection system for projecting the patterned beam onto a target portion of the substrate.

As exposure of a patterning device can take place with the patterning device in situ, i.e. in clean conditions in the lithographic apparatus, the patterning device is no longer subjected to increased possibility of contamination or damage through removal and replacement. Furthermore, because the patterning device (e.g. the mask) does not need to be removed from the clean conditions unnecessarily, device throughput is virtually unaffected. Exposure of a test substrate takes the same time as exposure of a production substrate and any further inspection of the test substrate can take place while production continues.

A substrate comprising a silicon wafer with a layer of SiO2 may be used as a reference substrate. A wafer with a nitride layer can also be used as a reference substrate. As will be apparent to those skilled in the art, other materials can be used, for example, to yield an accurate pattern with strong contrast. Photolithographic methods used to manufacture devices can then be employed and a highly accurate pattern etched into the SiO2 or other layer.

To avoid contamination, both the reference substrate and the patterning device should be stored in clean conditions. According to at least one embodiment, the patterning device need only be removed from clean conditions when a defect is detected.

For convenient comparison, the test substrate can be the reference substrate. In particular, the test substrate is patterned by exposing a layer of radiation sensitive material (resist). Once the test substrate has been scanned, the resist can be removed, and the test substrate reused.

The reference pattern is preferably printed at a plurality of different locations on the reference substrate, with sufficient space between each reference pattern to allow individual test patterns to be printed beside each of the reference patterns.

In order to compare a reference pattern and a test pattern, e.g. by means of a visual comparison, the patterned test substrate and reference substrate can be scanned by at least one optical defect inspection tool, possibly simultaneously. The optical defect inspection tool could be, for example, a microscope or a system using Scanning Electron Microscopy, such as KLA inspection systems (e.g. KLA-Tencor's 2139 system or KLA-Tencor's ES20 series). Multiple comparisons between reference and test patterns may be performed and majority voting can determine the location of the defect.

According to a further aspect of at least one embodiment, there is provided an inspection system including means for inspecting first and second patterns; and means for comparing said first and second patterns.

The means for inspecting first and second patterns preferably comprises two inspection tools capable of inspecting said first and second patterns simultaneously.

According to a further aspect of at least one embodiment, there is provided a computer program comprising program code means for instructing a lithographic projection apparatus to use a patterning device to print a reference pattern on a reference substrate and, at a later time, to use said patterning device to print a test pattern on the same reference substrate.

According to a further aspect of at least one embodiment, there is provided a computer program comprising program code means for instructing an inspection system to inspect first and second patterns and to compare said first and second patterns.

According to a further aspect of at least one embodiment, there is provided a reference substrate comprising a substrate having thereon a durable printed reference image of a pattern of a patterning device and no further patterned layers above said reference image.

According to yet a further aspect of at least one embodiment, there is provided a method of detecting defects in a patterning device of a photolithographic apparatus, the method comprising generating a reference pattern on a first substrate using a projection beam of radiation and the patterning device; generating a pattern on a second substrate using the projection beam of radiation and the patterning device; and comparing the reference pattern on the first substrate to the pattern on the second substrate to detect a defect in the patterning device.

As used herein, the terms "print" and "printed" comprise exposure. Those terms may also comprise exposure and development of a resist or exposure, development of a resist and etching. Although specific reference may be made in this text to the use of the apparatus according to at least one embodiment in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments will now be described, by way of example only, with reference to the accompanying schematic drawings in which.

In the Figures, corresponding reference symbols indicate corresponding parts.

DETAILED DESCRIPTION

Figure 1:
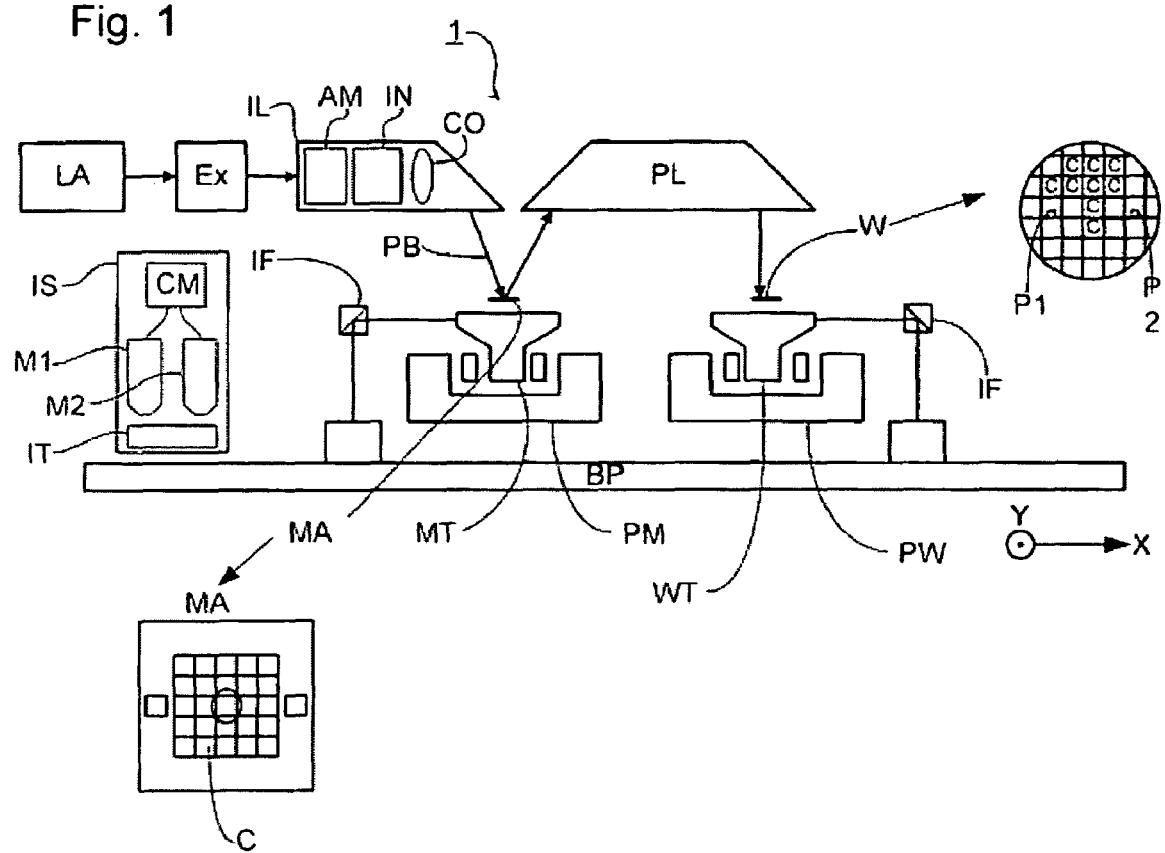
FIG. 1 depicts a lithographic projection apparatus according to at least one embodiment.

FIG. 1 schematically depicts a lithographic projection apparatus which is used in at least one embodiment. The apparatus includes
   a radiation system Ex, IL, for supplying a projection beam PB of radiation (e.g. EUV radiation), which in this particular case also comprises a radiation source LA;
   a first object table (mask table) MT provided with a mask holder for holding a mask MA (e.g. a reticle), and connected to first positioning means for accurately positioning the mask with respect to item PL;
   a second object table (substrate table) WT provided with a substrate holder for holding a substrate W (e.g. a resist-coated silicon wafer), and connected to second positioning means for accurately positioning the substrate with respect to item PL;
   a projection system ("lens") PL (e.g. a refractive lens system group) for imaging an irradiated portion of the mask MA onto a target portion C (e.g. comprising one or more dies) of the substrate W;
   an inspection system IS.

As here depicted, the apparatus is of a reflective type (e.g. has a reflective mask). However, in general, it may also be of a transmissive type, for example (e.g. with a transmissive mask). Alternatively, the apparatus may employ another kind of patterning device, such as a programmable mirror array of a type as referred to above.

The source LA (e.g. a laser-produced or discharge plasma source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed by the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
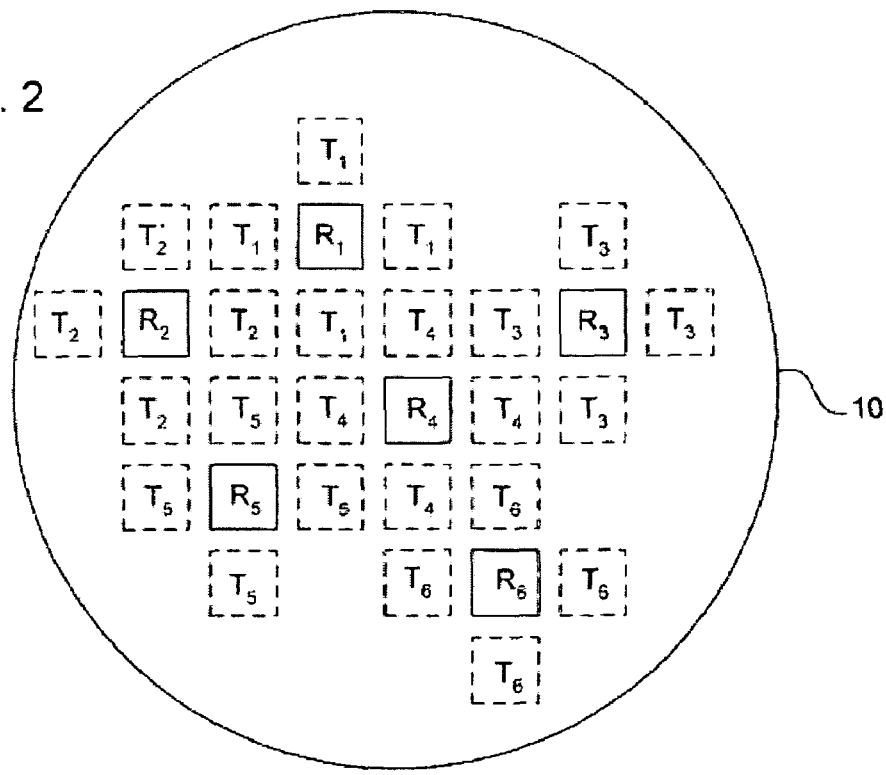
FIG. 2 depicts an arrangement of reference patterns and test patterns on a combined reference substrate and test substrate.
Figure 3:
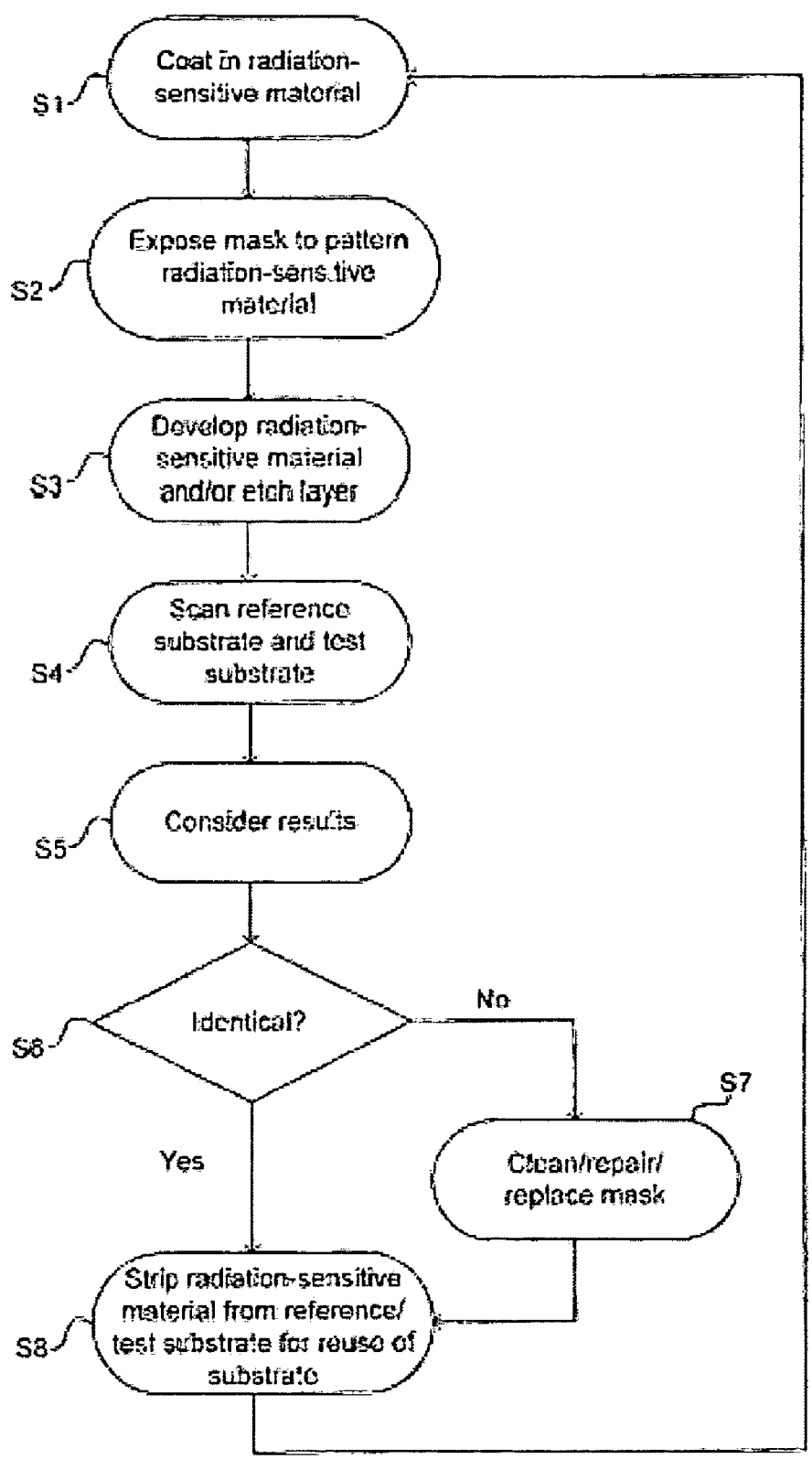
FIG. 3 is a flow diagram of a method of testing for a defect in a patterning device according to at least one embodiment.

A mask is assumed undamaged and clean when first installed in a lithographic apparatus and according to this embodiment of the present invention a reference substrate 10 is printed after installation of the mask by exposing a pattern of the mask onto the reference substrate 10. The reference substrate 10 is printed substantially directly after installation of the mask. The reference substrate 10 provides an "idealized" pattern with which to compare future possibly defective patterns. In this embodiment the reference substrate 10 is formed from a silicon substrate with an outer layer of $SiO_2$ of known purity and thickness. The substrate is coated with a resist. To print the reference substrate 10, the mask, already installed in the lithographic apparatus but not yet used in the production of devices such as ICs, is used to pattern a projection beam to expose the resist. As shown in FIG. 2, one or more substantially identical reference patterns $R_1$, $R_2$, $R_3$, $R_4$ . . . are exposed spaced apart. The resist material is developed to reveal the $SiO_2$ beneath, which is then etched, e.g. using hydrofluoric acid. When the remaining resist is removed the pattern(s) is/are revealed as an etched pattern(s) in the $SiO_2$. The reference substrate 10 is then kept in clean conditions until it is needed.

When, for example, a defect is suspected, the reference substrate 10 is coated in resist, step S1. In step S2 the mask patterns the projection beam to expose the resist in order to print substantially identical test patterns, $T_1$, $T_2$, $T_3$, $T_4$ . . . on the reference/test substrate next to the reference patterns $R_1$, $R_2$, $R_3$, $R_4$ . . . . After developing the resist and etching the exposed $SiO_2$ in step S3, the reference pattern and the test pattern of each pair are scanned by one or more respective microscopes simultaneously or in sequence in step S4. Depending on the resist type, the layer stack etc. the sensitivity of the microscope, or other inspection tool, is adjusted to obtain the highest contrast in the reference and test patterns. Meanwhile the lithographic apparatus can continue production. In S5 and S6 the results of the scans of $T_1$ and $R_1$ are considered to see if they are identical. If they are not identical there may be a defect in the mask, or alternatively there may be a random error in the single exposure of pattern $T_1$ or $R_1$. $T_2$ and $R_2$ may therefore be compared and if these are identical then it is assumed the difference between $T_1$ and $R_1$ was due to a random error and the mask is defect free. If $T_2$ and $R_2$ are not identical $T_3$ and $R_3$ and $T_4$ and $R_4$ etc. can be compared. Majority voting can be employed with respect to the comparisons of $T_1$ and $R_1$, $T_2$ and $R_2$, $T_3$ and $R_3$ etc. to determine if there is a defect. If a defect is present, $T_1$ and $R_1$ can be scanned in more detail to determine the exact location of the defect, by determining which small area of $T_1$ and $R_1$ is non-identical. In step S7 the mask is removed from the apparatus and cleaned, repaired or replaced if a defect is suspected. The reference/test substrate can be reused by printing test patterns $T_1$, $T_2$, $T_3$, $T_4$ . . . on different locations adjacent or near to the reference patterns $R_1$, $R_2$, $R_3$, $R_4$ . . . . The reference substrate 10 is returned to storage in clean conditions.

The above system is configured using a computer which uses details such as the pattern layout, layer stack and resist type to optimize the system. Furthermore a computer program may manage the arrangement of reference and test patterns on the reference and test substrates respectively.

In the above embodiments, the reference substrate 10 is the test substrate, but at least one embodiment is not limited to this, and the reference and test substrates can be different. Where the reference substrate and test substrate are different substrates, the reference substrate is printed with one or more reference patterns $R_1$, $R_2$, $R_3$, etc. This reference substrate is then used for comparison with one or more test substrates. A separate test substrate is then printed for comparison with the reference substrate. When comparison is complete, the resist on the test substrate can be stripped so that the test substrate can be reused for additional test patterns.

In the above embodiment, the reference and test substrate have been exposed, developed and etched before scanning by a microscope. Optionally, the reference and test substrates may also simply be exposed or exposed and developed, particularly where the reference and test substrate are different substrates. Alternatively, a surface other than $SiO_2$ which would give a pattern with good contrast could be used. For example, a layer of nitride on the silicon may be used.

In at least one embodiment, the patterning device is an EUV mask, such as a reflective mask.

While specific embodiments have been described above, it will be appreciated that at least one embodiment may be practiced otherwise than as described. The description is not intended to limit the embodiments.

What is claimed is:

1. A method of detecting defects in a patterning device in a photolithographic process comprising:
   printing a reference pattern on a reference substrate using the patterning device and a beam of radiation;
   printing a pattern for manufacture of a device on a production substrate different from said reference substrate using the patterning device and beam of radiation;
   printing a test pattern on a test substrate using the patterning device and beam of radiation; and
   comparing the printed test pattern to the printed reference pattern to detect a defect in the patterning device.

2. A method of detecting defects in a patterning device according to claim 1, wherein the reference substrate is a silicon wafer.

3. A method of detecting defects in a patterning device according to claim 1, wherein the reference substrate is a silicon wafer having an SiO2 layer and the printed reference pattern is etched into the SiO2 layer.

4. A method of detecting defects in a patterning device according to claim 1, wherein the test substrate is the reference substrate.

5. A method of detecting defects in a patterning device according to claim 1, wherein the printed test pattern is a pattern in developed resist.

6. A method of detecting defects in a patterning device according to claim 1, wherein the reference pattern is printed at a plurality of different locations on the reference substrate.

7. A method of detecting defects in a patterning device according to claim 6, wherein individual printed reference patterns are spaced such that an individual test pattern can be printed beside each individual printed reference pattern.

8. A method of detecting defects in a patterning device according to claim 1, wherein in comparing the printed test pattern to the printed reference pattern the patterned test substrate and reference substrate are scanned by at least one optical defect inspection tool.

9. A method of detecting defects in a patterning device according to claim 8, wherein in comparing the printed test pattern to the printed reference pattern the patterned test substrate and reference substrate are scanned simultaneously by respective optical defect inspection tools.

10. A method of detecting defects in a patterning device according to claim 8, wherein multiple comparisons take place between multiple printed reference patterns and multiple printed test patterns.

11. A method of detecting defects in a patterning device according to claim 10, wherein majority voting determines location of the defect in the patterning device.

12. A method of detecting defects in a patterning device according to claim 1, wherein said patterning device is a photolithography mask.

13. A method of detecting defects in a patterning device of a photolithographic apparatus, the method comprising:

generating a reference pattern on a first substrate using a beam of radiation and the patterning device;

generating a pattern on a second substrate using the beam of radiation and the patterning device; and comparing the reference pattern on the first substrate to the pattern on the second substrate to detect a defect in the patterning device.

14. A method of detecting defects in a patterning device according to claim 13, wherein the pattern is a test pattern and the second substrate is a test substrate.

15. A method of detecting defects in a patterning device according to claim 13, wherein the pattern is a test pattern and the second substrate is the first substrate.

16. A method of detecting defects in a patterning device according to claim 13, wherein the pattern comprises features of a manufactured device and the second substrate comprises the manufactured device.

* * * * *